(12) United States Patent
Park et al.

(10) Patent No.: US 12,334,170 B2
(45) Date of Patent: Jun. 17, 2025

(54) OPERATING AND TESTING SEMICONDUCTOR DEVICES

(71) Applicant: Samsung Electronics Co., Ltd., Suwon-si (KR)

(72) Inventors: Taewook Park, Suwon-si (KR); Eunhye Oh, Suwon-si (KR); Jisu Kang, Suwon-si (KR); Yongki Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 105 days.

(21) Appl. No.: 18/314,508

(22) Filed: May 9, 2023

(65) Prior Publication Data
US 2024/0006008 A1    Jan. 4, 2024

(30) Foreign Application Priority Data

Jul. 4, 2022 (KR) .......................... 10-2022-0082139

(51) Int. Cl.
| | |
|---|---|
| G11C 29/36 | (2006.01) |
| G01R 31/317 | (2006.01) |
| G01R 31/3193 | (2006.01) |
| G06F 11/10 | (2006.01) |
| G11C 29/00 | (2006.01) |
| G11C 29/02 | (2006.01) |

(Continued)

(52) U.S. Cl.
CPC ........ *G11C 29/36* (2013.01); *G01R 31/31703* (2013.01); *G01R 31/3193* (2013.01); *G06F 11/1048* (2013.01); *G11C 29/022* (2013.01); *G11C 29/42* (2013.01); *G11C 29/44* (2013.01); *G11C 29/4401* (2013.01); *G11C 29/52* (2013.01); *G11C 29/56008* (2013.01); *G11C 29/76* (2013.01); *G11C 29/78* (2013.01); *G11C 29/808* (2013.01); *G11C 2029/1204* (2013.01); *G11C 2029/3602* (2013.01)

(58) Field of Classification Search
CPC ........ G11C 29/44; G11C 29/52; G11C 29/10; G11C 2029/3602; G11C 29/56008; G11C 29/36; G11C 29/4401; G11C 29/808; G11C 2029/1204; G01R 31/31703; G01R 31/3193

See application file for complete search history.

(56) References Cited

U.S. PATENT DOCUMENTS 6,539,506 B1 * 3/2003 Lammers ............... G11C 29/44
714/704
8,037,376 B2    10/2011 Anzou et al.
(Continued)

FOREIGN PATENT DOCUMENTS

| JP | H06-161796 | 6/1994 |
|---|---|---|
| KR | 10-0911252 | 8/2009 |

OTHER PUBLICATIONS

Extended European Search Report in European Appln No. 23174961.5, mailed on Feb. 16, 2024, 10 pages.

*Primary Examiner* — John J Tabone, Jr.
(74) *Attorney, Agent, or Firm* — Fish & Richardson P.C.

(57) ABSTRACT

An operation method of a memory device includes programming a test pattern in a normal area, obtaining locations of error bits with respect to the test pattern and an error count for each error bit location, and repairing faulty cells included in the normal area with redundancy cells in a redundancy area based on the locations of the error bits and the error counts.

20 Claims, 18 Drawing Sheets

(51) Int. Cl.
*G11C 29/12* (2006.01)
*G11C 29/42* (2006.01)
*G11C 29/44* (2006.01)
*G11C 29/52* (2006.01)
*G11C 29/56* (2006.01)

(56) References Cited

U.S. PATENT DOCUMENTS

| | | |
|---|---|---|
| 8,289,770 B2 | 10/2012 | Lee et al. |
| 8,495,438 B2 | 7/2013 | Roine |
| 9,087,612 B2 | 7/2015 | Franceschini et al. |
| 2008/0201620 A1* | 8/2008 | Gollub ............... G11C 29/4401 |
| | | 714/718 |
| 2010/0235695 A1* | 9/2010 | Lee ...................... G11C 29/44 |
| | | 714/763 |
| 2012/0229155 A1 | 9/2012 | Anzou et al. |
| 2019/0027230 A1* | 1/2019 | Ryu .................... G06F 11/1048 |
| 2021/0124659 A1* | 4/2021 | Ryu ...................... G11C 17/18 |
| 2022/0293205 A1 | 9/2022 | Oh et al. |
| 2024/0006008 A1* | 1/2024 | Park ...................... G11C 29/36 |

\* cited by examiner

OPERATING AND TESTING SEMICONDUCTOR DEVICES

CROSS-REFERENCE TO RELATED APPLICATION

This application is based on and claims priority under 35 U.S.C. § 119 to Korean Patent Application No. 10-2022-0082139, filed on Jul. 4, 2022, in the Korean Intellectual Property Office, the disclosure of which is incorporated by reference herein in its entirety.

BACKGROUND

Recently, storage devices, such as a solid state drives (SSD), have been widely used, and a storage device facilitates a lot of data to be stored or moved. Faulty cells within such storage devices can cause bit flips during a write operation and a read operation on data stored in the storage devices.

SUMMARY

The subject matter of the present disclosure relates to operating semiconductor devices, and more particularly, to detecting a location of a faulty cell of a memory devices based on, e.g., locations of error bits and an error count. The subject matter if the present disclosure further relates to performing one or more repair operations based on the location of the faulty cell. Accurately detecting a faulty cell and efficiently repairing the faulty cell can, in some implementations, prevent bit flips.

In general, innovative aspects of the subject matter described in this specification include an operation method of a memory device, the operation method including performing a plurality of program operations on a normal area based on a test pattern, performing a plurality of read operations based on the programmed test pattern, and obtaining locations of error-occurred cells among a plurality of memory cells included in the normal area and an error count for each location by detecting errors with respect to the test pattern based on the plurality of program operations and read operations.

Another general aspect can be embodied in a semiconductor device including a memory cell array including a normal area containing normal memory cells and a redundancy area containing redundancy memory cells, a test circuit configured to detect whether an error has occurred in each of the normal memory cells and an error count of each memory cell based on a plurality of write operations and a plurality of read operations performed on the normal memory cells by using a test pattern, and a decoder circuit configured to select a normal memory cell or a redundancy memory cell based on an address.

Another general aspect can include a test method of a memory device, the test method including performing a plurality of program operations on a normal area based on a test pattern, performing a plurality of read operations on the test pattern, each read operation corresponding to one of the plurality of program operations, obtaining locations of error bits among bits constituting the test pattern and an error count for each location based on an error correction operation on a result of the plurality of read operations, and detecting a fault storage region among storage regions included in the normal area, based on the locations of the error bits and the error count for each location.

BRIEF DESCRIPTION OF THE DRAWINGS

Implementations of the subject matter of the present disclosure will be more clearly understood from the following detailed description taken in conjunction with the accompanying drawings in which.

DETAILED DESCRIPTION

Hereinafter, various implementations are described with reference to the accompanying drawings.

Figure 1:
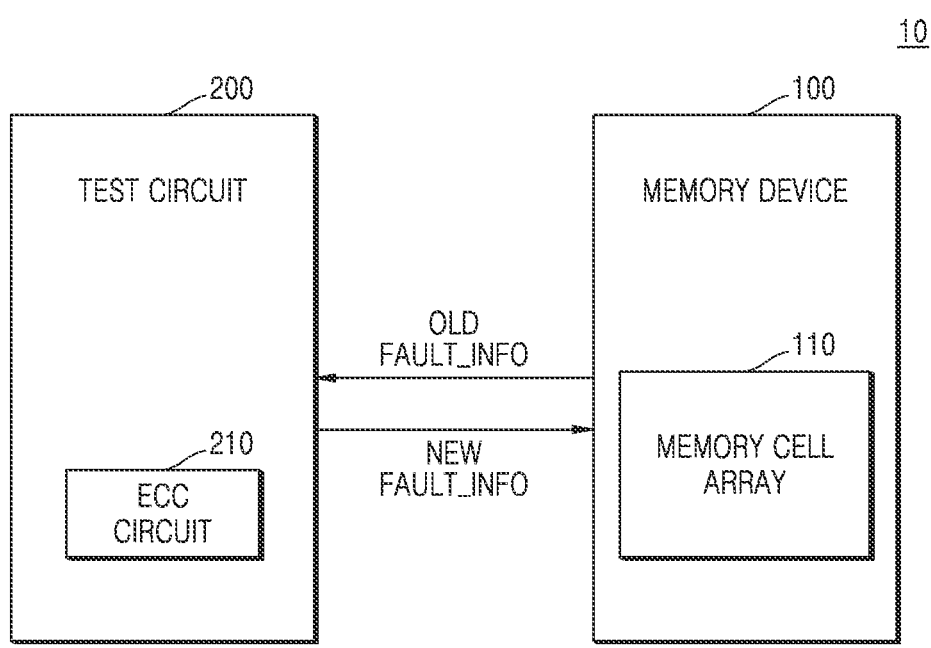
FIG. 1 is a block diagram illustrating an example of a semiconductor device.

FIG. 1 is a block diagram illustrating an example of a semiconductor device 10.

Referring to FIG. 1, the semiconductor device 10 may include a memory device 100 and a test circuit 200.

The memory device 100 may include a memory cell array 110. The memory cell array 110 may include word lines, bit lines, and memory cells respectively connected to the word lines and the bit lines. The memory cells may store data of at least one bit. The memory cells may be implemented by a nonvolatile memory capable of storing data regardless of whether power is supplied thereto or a volatile memory capable of storing data only while power is being supplied thereto, and use a physical fuse-cutting method using a laser or a storing method using electrical programming. For example, the memory cells may include dynamic random access memory (DRAM), static random access memory (SRAM), electrically erasable programmable read-only memory (EEPROM), flash memory, magnetic random access memory (MRAM), conductive bridging random access memory (CBRAM), ferroelectric random access memory (FeRAM), phase change random access memory (PRAM), or resistive random access memory (RRAM or ReRAM). Herein, the memory cell array 110 may be implemented two-dimensionally or three-dimensionally.

The test circuit 200 may perform a test operation on the memory cells included in the memory cell array 110. For example, the test circuit 200 may detect a fault cell by repeatedly writing and reading data in and from the memory cell array 110 and identifying an error included in the read data. In the specification, a write operation may be referred to as a program operation. Particularly, the test circuit 200 may program fault information FAULT_INFO in the memory cell array 110. For example, initially, the test circuit 200 may program a zero bitstream as the fault information FAULT_INFO in the memory cell array 110. The fault information FAULT_INFO may be information indicating locations of error-occurred bits and an error count for each location. Hereinafter, data initially programmed in the memory cell array 110 may be referred to as initial fault information. The fault information FAULT_INFO will be described below in detail with reference to FIGS. 5 to 8.

The test circuit 200 may obtain existing fault information OLD FAULT_INFO from the memory cell array 110, and generate new fault information NEW FAULT_INFO by cumulatively updating locations of error bits and an error count for each location, which are indicated by the existing fault information OLD FAULT_INFO. The test circuit 200 may identify an error bit location and an error count for each of bits constituting the existing fault information OLD FAULT_INFO, and generate the new fault information NEW FAULT_INFO based on the identified error bit location and error count.

The test circuit 200 may program the new fault information NEW FAULT_INFO in a storage region (e.g., a page) of the memory cell array 110, in which the existing fault information OLD FAULT_INFO has been stored. For example, the test circuit 200 may provide information about fault cells and normal cells in a first storage region by repeatedly performing an operation of programming, in the first storage region, error bit locations and error counts for data read from the first storage region.

In some implementations, the memory device 100 may further include a buffer memory. The test circuit 200 may repeatedly write and read a test pattern (e.g., the initial fault information) in and from a second storage region of the memory cell array 110. The test circuit 200 may update the existing fault information OLD FAULT_INFO to the new fault information NEW FAULT_INFO based on the read test pattern and store the new fault information NEW FAULT_INFO in the buffer memory.

The test circuit 200 may store a physical address of the second storage region in the buffer memory together with the new fault information NEW FAULT_INFO. In other words, the test circuit 200 may provide information about fault cells and normal cells in the second storage region by repeatedly performing an operation of storing, in the buffer memory, error bit locations and error counts for data read from the second storage region.

In some implementations, the test circuit 200 may include an error correction code (ECC) circuit 210. The ECC circuit 210 may provide a higher error correction performance than an ECC circuit 2170 included in a memory controller (e.g., 2100 of FIG. 16) configured to control the memory device 100. For example, the ECC circuit 210 may detect four error bits maximum and correct the detected error bits. The ECC circuit 2170 of FIG. 16 may detect three error bits maximum and correct the detected error bits. The test circuit 200 may identify locations of error bits included in the existing fault information OLD FAULT_INFO and an error count for each error bit location based on the ECC circuit 210. The test circuit 200 will be described below in detail with reference to FIGS. 9 and 10.

The semiconductor device 10 may provide information about fault cells and normal cells included in a storage region by repeatedly writing and reading data in and from the storage region having the same physical address and identifying locations of error-occurred bits among bits constituting the read data and an error count for each location.

Figure 2:
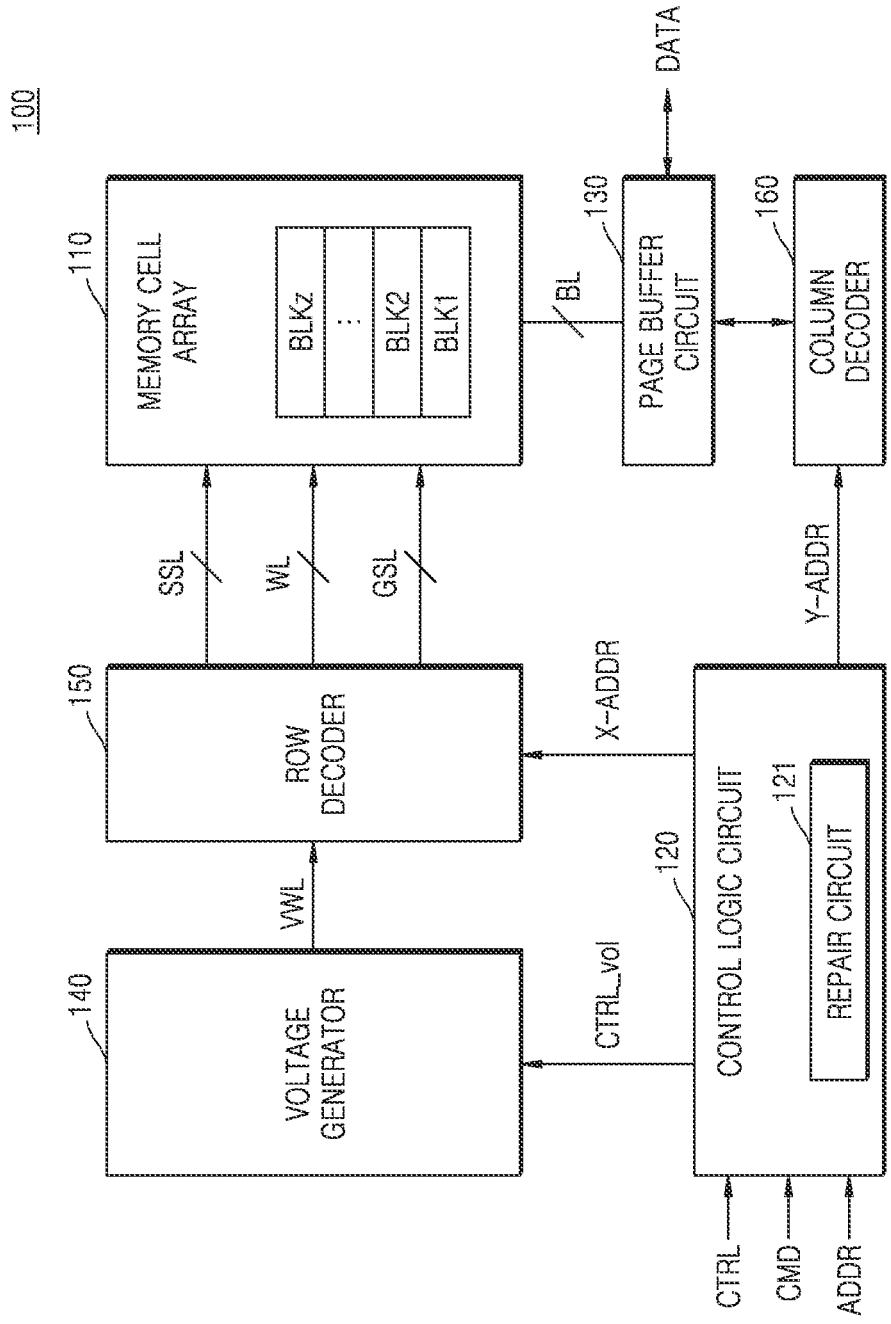
FIG. 2 is a block diagram illustrating an example of a memory device.

FIG. 2 is a block diagram illustrating an example of the memory device 100. Referring to FIG. 2, the memory device 100 may include a control logic circuit 120, the memory cell array 110, a page buffer circuit 130, a voltage generator 140, a row decoder 150, and a column decoder 160. Although not shown in FIG. 2, the memory device 100 may further include a pre-decoder, a temperature sensor, a command decoder, an address decoder, and the like. In the specification, the row decoder 150 and the column decoder 160 may be referred to as a decoder circuit.

The control logic circuit 120 may generally control various kinds of operations in the memory device 100. The control logic circuit 120 may output various kinds of control signals in response to a command CMD, control signal CTRL and/or an address ADDR. For example, the control logic circuit 120 may output a voltage control signal CTRL_vol, a row address X-ADDR, and a column address Y-ADDR. The control logic circuit 120 may include a repair circuit 121. The repair circuit 121 may control the row decoder 150 or the column decoder 160 to activate a word line or a bit line for a normal cell when an address of a fault cell is received. The repair circuit 121 may store addresses of cells storing error bits included in the fault information FAULT_INFO. That is, the repair circuit 121 may store an address of a fault cell. The repair circuit 121 will be described in detail with reference to FIG. 15.

The memory cell array 110 may include a plurality of memory blocks BLK1 to BLKz (z is a positive integer), and each of the plurality of memory blocks BLK1 to BLKz may include a plurality of memory cells. The memory cell array 110 may be connected to the page buffer circuit 130 through a plurality of bit lines BL and connected to the row decoder 150 through a plurality of word lines WL, a plurality of string select lines SSL, and a plurality of ground select lines GSL. Memory cells connected to one word line WL may be referred to as a page.

In some implementations, the memory cell array 110 may include a three-dimensional memory cell array, and the three-dimensional memory cell array may include a plurality of NAND strings. Each NAND string may include memory cells respectively connected to word lines vertically stacked on a substrate. U.S. Pat. Nos. 7,679,133, 8,553,466, 8,654, 587, and 8,559,235 and US Patent Application No. 2011/02333648 are combined with the specification in a cited form. In some implementations, the memory cell array 110 may include a two-dimensional memory cell array, and the two-dimensional memory cell array may include a plurality of NAND strings arranged in row and column directions.

The page buffer circuit 130 may include a plurality of page buffers, and the plurality of page buffers may be connected to memory cells through the plurality of bit lines BL, respectively. The page buffer circuit 130 may select at least one of the plurality of bit lines BL based on control of the column decoder 160. For example, the repair circuit 121 can control the column decoder 160 to activate a bit line BL, and, in response, the page buffer circuit 130 can select the activated bit line BL. The page buffer circuit 130 may operate as a write driver or a sense amplifier according to an operation mode. For example, in a program operation, the page buffer circuit 130 may apply, to a selected bit line BL, a bit line voltage corresponding to data to be programmed. In a read operation, the page buffer circuit 130 may sense data stored in a memory cell by sensing a current or voltage of a selected bit line BL.

The voltage generator 140 may generate various kinds of voltages for performing program, read, and erase operations, based on the voltage control signal CTRL_vol. For example, the voltage generator 140 may generate a program voltage, a read voltage, a program verify voltage, an erase voltage, or the like as a word line voltage VWL.

The row decoder 150 may select one of the plurality of word lines WL and one of the plurality of string select lines SSL based on the row address X-ADDR. For example, the row decoder 150 can make the selection in response to the control logic circuit 120 outputting the row address X-ADDR or the row decoder 150 receiving the row address X-ADDR. For example, in a program operation, the row decoder 150 may apply the program voltage and the program verify voltage to the selected word line WL, and in a read operation, the row decoder 150 may apply the read voltage to the selected word line WL.

The column decoder 160 may control the page buffer circuit 130 to select one of the plurality of bit lines BL based on the column address Y-ADDR. For example, the column decoder 160 can control the page buffer circuit 130 to select one of the plurality of the bit lines BL in response to the control logic circuit 120 outputting the column address Y-ADDR or the column decoder 160 receiving the column address Y-ADDR.

Figure 3:
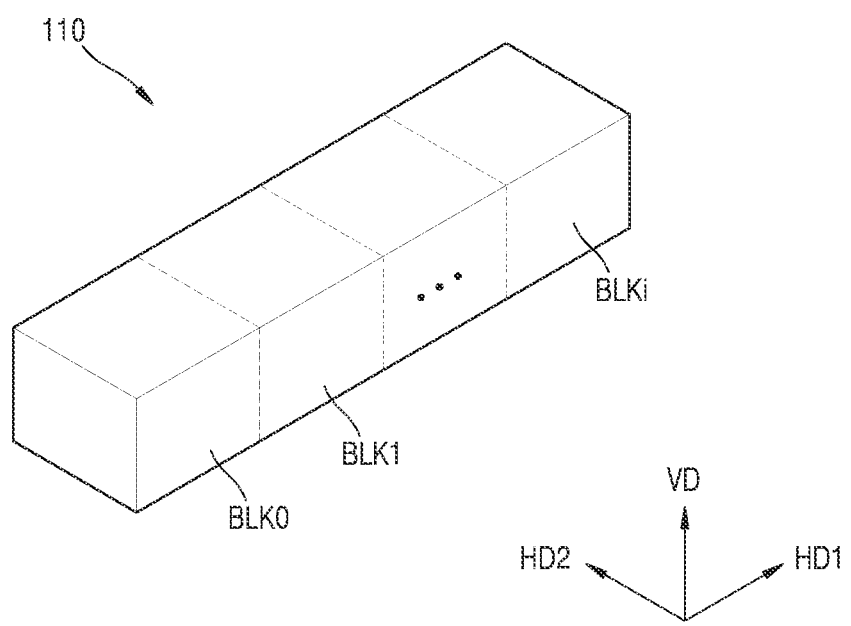
FIG. 3 is a perspective view illustrating an example of a memory cell of FIG. 2.

FIG. 3 is a perspective view illustrating an example of a memory cell array 110 of FIG. 2.

Referring to FIG. 3, the memory cell array 110 may include a plurality of memory blocks BLK0 to BLKi, where i may be a positive integer. Each of the plurality of memory blocks BLK0 to BLKi may have a three-dimensional structure (or a vertical structure). Particularly, each of the plurality of memory blocks BLK0 to BLKi may include a plurality of NAND strings extending in a vertical direction VD. Herein, the plurality of NAND strings may be provided to be separated by a particular distance from each other in first and second horizontal directions HD1 and HD2. The plurality of memory blocks BLK0 to BLKi may be selected by a row decoder (150 of FIG. 2). For example, the row decoder 150 may select a memory block corresponding to a block address from among the plurality of memory blocks BLK0 to BLKi.

Figure 4:
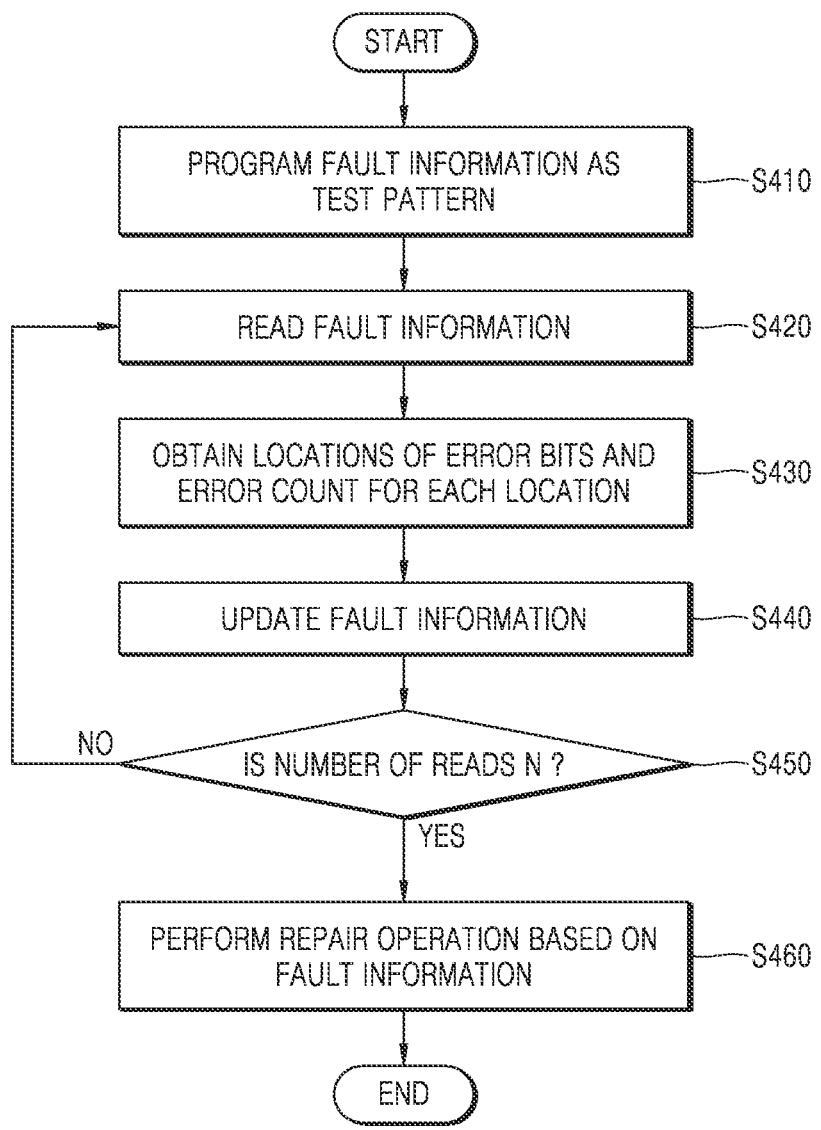
FIG. 4 is a flowchart illustrating an example of an operation method of a semiconductor device.

FIG. 4 is a flowchart illustrating an example of an operation method of a semiconductor device. FIG. 4 is described with reference to FIGS. 1 and 2. The operation method of the semiconductor device may include a plurality of operations 5410 to 5460.

In operation 5410, the test circuit 200 may program the fault information FAULT_INFO as a test pattern in the memory device 100.

In operation 5420, the test circuit 200 may read the existing fault information OLD FAULT_INFO from the memory device 100.

In operation 5430, the test circuit 200 may obtain locations of error bits among bits constituting the existing fault information OLD FAULT_INFO and an error count for each error bit location. In some implementations, the test circuit 200 may obtain the locations of the error bits and error counts through an error correction operation on the existing fault information OLD FAULT_INFO. In some implementations, the test circuit 200 may obtain the locations of the error bits and the error counts through a comparison between the read existing fault information OLD FAULT_INFO and a pre-stored test pattern. A particular method will be described below with reference to FIGS. 9 and 10.

In operation 5440, the test circuit 200 may cumulatively update the fault information FAULT_INFO. In some implementations, the test circuit 200 may generate a plurality of packets based on the error bit locations and the error counts obtained in operation 5430 and generate the new fault information NEW FAULT_INFO based on the plurality of packets. The test circuit 200 may program the generated new fault information NEW FAULT_INFO in the first storage region, in which the existing fault information OLD FAULT_INFO has been stored. The test circuit 200 may store the new fault information NEW FAULT_INFO in the first storage region through an overwrite operation or a write-after-erase operation. In operation 5450, if a read count is N, the operation method may proceed to operation 5460, and if the read count is not N, the operation method may proceed back to operation 5420. N may be a positive integer. That is, as shown in FIG. 4, the fault information FAULT_INFO may be read N times and cumulatively updated N times. By cumulatively updating the fault information FAULT_INFO N times, final fault information FAULT_INFO may include locations of error-occurred bits among bits constituting the test pattern and an error count for each location.

In operation 5460, the repair circuit 121 may perform a repair operation based on the fault information FAULT_INFO. In some implementations, the test circuit 200 may identify fault cells based on the error bit locations and the error counts included in the fault information FAULT_INFO and provide an address of the fault cells to the repair circuit 121. In some implementations, a memory controller (2100 of FIG. 16) configured to control the memory device 100 may identify fault cells based on the fault information FAULT_INFO and provide an address of the fault cells to the repair circuit 121.

In some implementations, fault cells included in the memory cell array 110 may be accurately detected based on the fault information FAULT_INFO, thereby increasing the reliability of a repair operation.

Figure 5A:
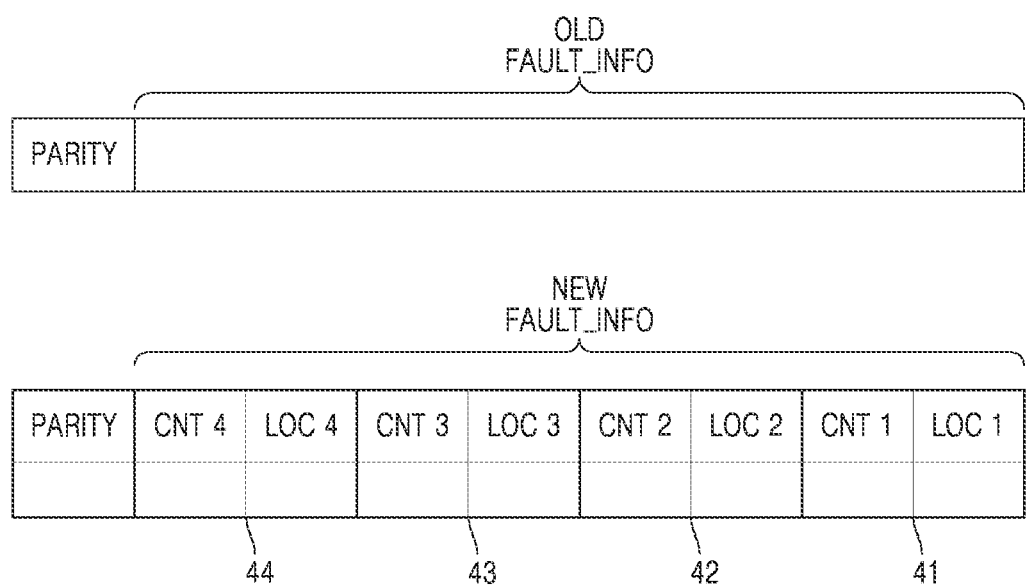
FIGS. 5A and 5B illustrate an example of fault information.
Figure 5B:
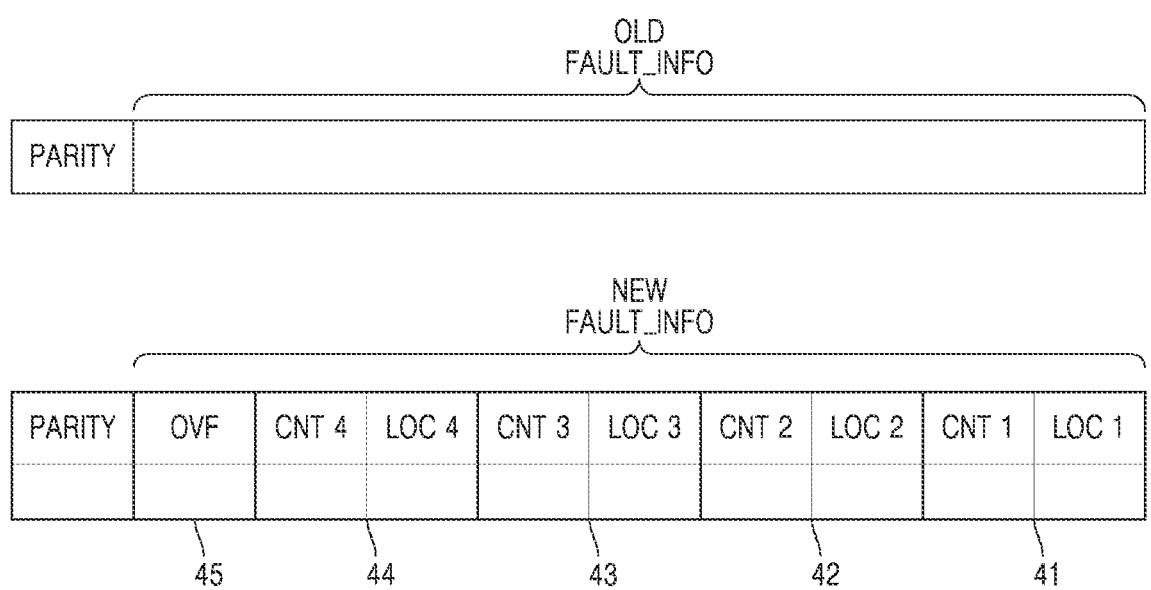

FIGS. 5A and 5B illustrate an example of fault information. FIGS. 5A and 5B are described with reference to FIG. 1. FIGS. 5A and 5B may illustrate a case where no error has occurred in the existing fault information OLD FAULT_INFO read from the memory cell array 110.

The existing fault information OLD FAULT_INFO may be data read from the memory cell array 110, and the new fault information NEW FAULT_INFO may be data to be programmed in the memory cell array 110 by the test circuit 200.

Referring to FIGS. 5A and 5B, the existing fault information OLD FAULT_INFO may be read together with a parity from the memory cell array 110. The parity may be data for identifying and correcting errors of bits constituting the existing fault information OLD FAULT_INFO. That is, because the errors of the bits constituting the existing fault information OLD FAULT_INFO are corrected based on the parity, the existing fault information OLD FAULT_INFO may be maintained, and because locations of the error bits are identified, an error count for each location may be cumulatively counted to generate the new fault information NEW FAULT_INFO based on the existing fault information OLD FAULT_INFO. Although not shown, the existing fault information OLD FAULT_INFO may have the same bit structure as the new fault information NEW FAULT_INFO to be described below.

The new fault information NEW FAULT_INFO may include first to fourth packets 41 to 44 and a parity. The parity may be data for identifying and correcting errors of bits constituting the first to fourth packets 41 to 44. Each of the first to fourth packets 41 to 44 may include information about a location of an error bit and information about the number of errors which have occurred at a corresponding location. For example, the first packet 41 may include a first error location LOC 1 and a first error count CNT 1 at the first error location LOC 1, the second packet 42 may include a second error location LOC 2 and a second error count CNT 2 at the second error location LOC 2, the third packet 43 may include a third error location LOC 3 and a third error count CNT 3 at the third error location LOC 3, and the fourth packet 44 may include a fourth error location LOC 4 and a fourth error count CNT 4 at the fourth error location LOC 4. As shown in FIG. 5A, if there is no error bit in the existing fault information OLD FAULT_INFO, the new fault information NEW FAULT_INFO may be the same as the existing fault information OLD FAULT_INFO. That is, no error may be recorded on the first to fourth packets 41 to 44 included in the new fault information NEW FAULT_INFO. The number of packets which may be included in the fault information FAULT_INFO is not limited thereto.

Referring to FIG. 5B, the new fault information NEW FAULT_INFO may further include an overflow packet 45. The overflow packet 45 may indicate whether error bits exceeding an error correction range have been generated in the existing fault information OLD FAULT_INFO. The overflow packet 45 may include at least one bit. For example, if error bits exceeding the error correction range have been generated, the overflow packet 45 may include '1', and if error bits exceeding the error correction range have not been generated, the overflow packet 45 may include '0'. Particularly, the ECC circuit 210 of FIG. 1 may correct four error bits maximum, and if five error bits have been generated in the existing fault information OLD FAULT_INFO, the overflow packet 45 may include '1'.

Figure 6:
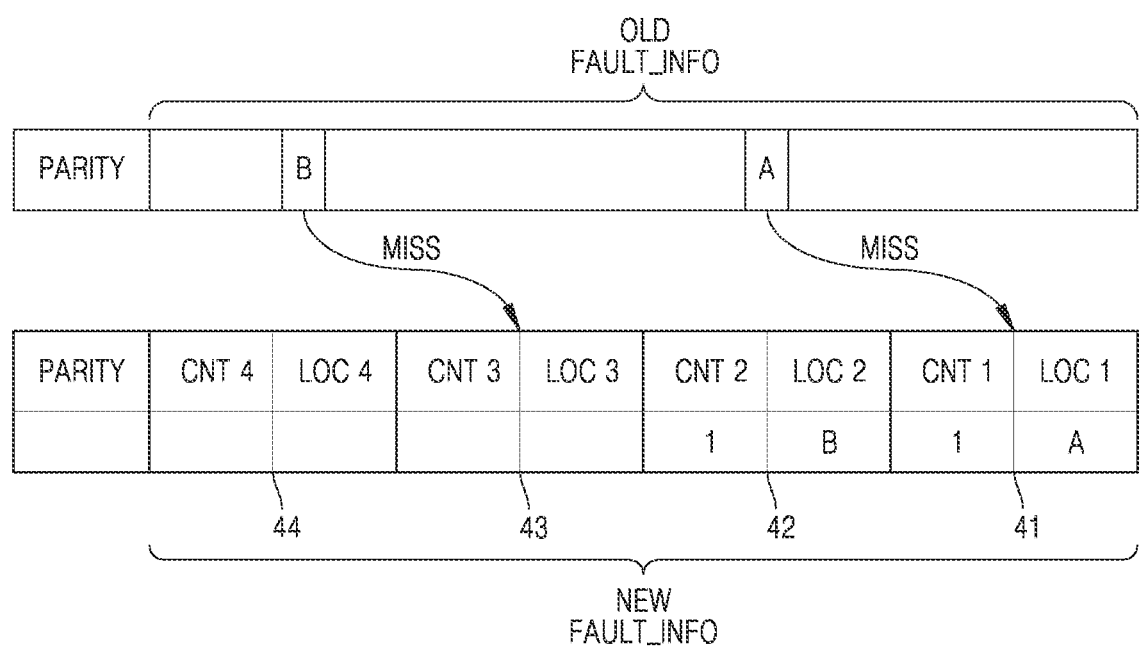
FIG. 6 illustrates an example of fault information.

FIG. 6 illustrates an example of fault information. FIG. 6 is described with reference to FIG. 1. FIG. 6 may illustrate a case where errors have been first generated in the existing fault information OLD FAULT_INFO read from the memory cell array 110.

Referring to FIG. 6, errors may occur in an $A^{th}$ bit and a $B^{th}$ bit of the existing fault information OLD FAULT_INFO. The $A^{th}$ bit may be closer to a least significant bit (LSB) than the $B^{th}$ bit. The test circuit 200 may generate the new fault information NEW FAULT_INFO by recording error information about the $A^{th}$ bit in the first packet 41 and recording error information about the $B^{th}$ bit in the second packet 42. Particularly, the test circuit 200 may record A indicating a location of an error bit in the first error location LOC 1 and record, in the first error count CNT 1, 1 indicating the number of errors which have occurred in the $A^{th}$ bit. The test circuit 200 may record B indicating a location of an error bit in the second error location LOC 2 and record, in the second error count CNT 2, 1 indicating the number of errors which have occurred in the $B^{th}$ bit. If locations of error-occurred bits are not included in the existing fault information OLD FAULT_INFO, this case may be represented by MISS.

Figure 7:
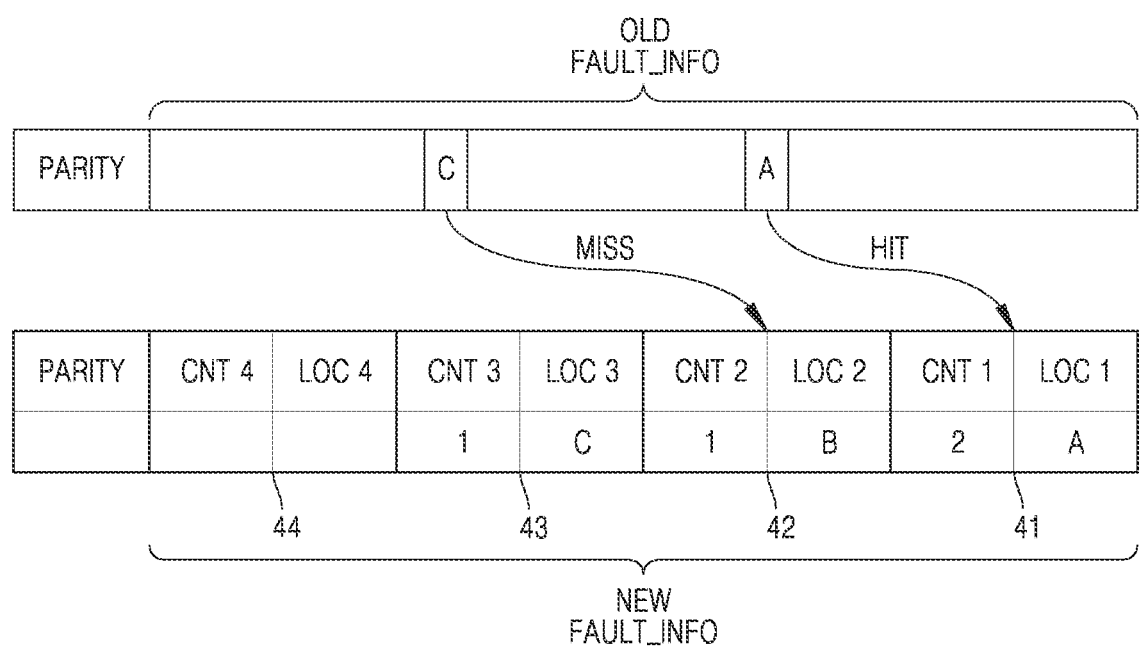
FIG. 7 illustrates an example of fault information.

FIG. 7 illustrates an example of fault information. FIG. 7 is described with reference to FIG. 1. FIG. 7 may illustrate a case where errors have occurred again in the existing fault information OLD FAULT_INFO read from the memory cell array 110.

Referring to FIG. 7, errors may occur in the $A^{th}$ bit and a $C^{th}$ bit of the existing fault information OLD FAULT_INFO. The $A^{th}$ bit may be closer to the LSB than the $C^{th}$ bit. In some implementations, the $A^{th}$ bit may be closer to a most significant bit (MSB) than the $C^{th}$ bit. The test circuit 200 may generate the new fault information NEW FAULT_INFO by recording error information about the $A^{th}$ bit in the first packet 41 and recording error information about the $C^{th}$ bit in the third packet 43. Particularly, the test circuit 200 may record A indicating a location of an error bit in the first error location LOC 1 and record, in the first error count CNT 1, the number 2, which indicates the cumulative number of errors which have occurred in the $A^{th}$ bit. The test circuit 200 may record C indicating a location of an error bit in the third error location LOC 3 and record, in the third error count CNT 3, the number 1, which indicates the number of errors which have occurred in the $C^{th}$ bit. Like the $A^{th}$ bit, if a location of an error-occurred bit is included in the existing fault information OLD FAULT_INFO, this case may be represented by HIT.

Figure 8:
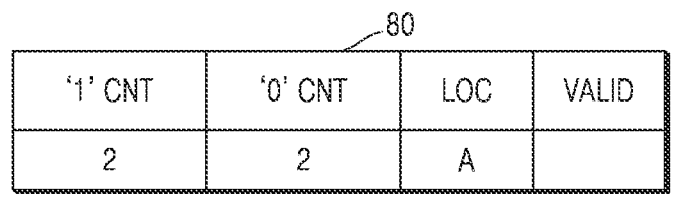
FIG. 8 illustrates an example of a packet.

FIG. 8 illustrates a packet 80. FIG. 8 is described with reference to FIGS. 1 and 5A to 7. The packet 80 of FIG. 8 may be an example of one of the first to fourth packets 41 to 44 of FIG. 7.

Referring to FIG. 8, the packet 80 may include the number '1' CNT of '1' errors, the number '0' CNT of '0' errors, an error location LOC, and valid information VALID.

The number '1' CNT of '1' errors may be counted when a bit recorded with '1' is read as '0'. The number '0' CNT of '0' errors may be counted when a bit recorded with '0' is read as '1'. The valid information VALID may include one bit. The valid information VALID may be '1' if an error has occurred in the existing fault information OLD FAULT_INFO and '0' if no error has occurred in the existing fault information OLD FAULT_INFO. For example, the valid information VALID of each of the first to fourth packets 41 to 44 in the new fault information NEW FAULT_INFO in FIG. 5A may be '0'.

Figure 9:
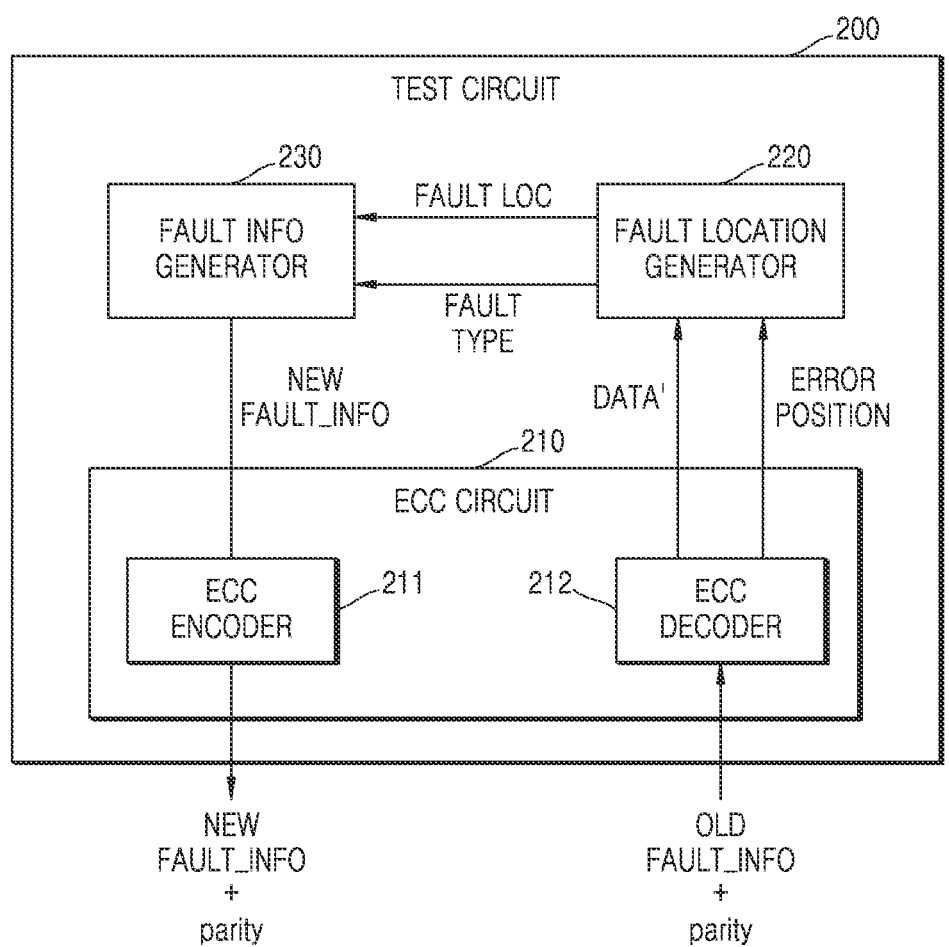
FIG. 9 is a block diagram illustrating an example of a test circuit.

FIG. 9 is a block diagram illustrating the test circuit 200. FIG. 9 is described with reference to FIG. 1.

The test circuit 200 may receive the existing fault information OLD FAULT_INFO and a parity for the existing fault information OLD FAULT_INFO from the memory device 100 and provide new fault information NEW FAULT_INFO and a parity for the new fault information NEW FAULT_INFO to the memory device 100.

The test circuit 200 may include the ECC circuit 210, a fault location generator 220, and a fault information generator 230.

The ECC circuit 210 may receive the existing fault information OLD FAULT_INFO and a parity for the existing fault information OLD FAULT_INFO and detect and correct errors of bits constituting the existing fault information OLD FAULT_INFO. The ECC circuit 210 may output corrected data DATA' and error location information ERROR LOC. The corrected data DATA' may be generated by flipping error bits of the existing fault information OLD FAULT_INFO. The error location information ERROR LOC may be information in which, among the bits constituting the existing fault information OLD FAULT_INFO, locations of error-occurred bits are represented by '1', and locations of non-error-occurred bits are represented by '0'. That is, a length of the error location information ERROR LOC may be the same as a sum of lengths of packets (e.g., 41 to 44 of FIG. 4) included in the existing fault information OLD FAULT_INFO.

The fault location generator 220 may receive the corrected data DATA' and the error location information ERROR LOC and generate fault location information FAULT LOC and a fault type FAULT TYPE.

The fault location information FAULT LOC may have a value indicating locations of error-occurred bits among the bits constituting the existing fault information OLD FAULT_INFO. For example, the fault location information FAULT LOC may be represented by hexadecimal.

The fault type FAULT TYPE may indicate an error type. For example, the fault type FAULT TYPE may be '0' when data recorded as '0' is read as '1' due to an error, and '1' when data recorded as '1' is read as '0' due to an error.

The fault information generator 230 may generate packets based on the fault location information FAULT LOC and the fault type FAULT TYPE and generate the new fault information NEW FAULT_INFO by merging the packets. For example, as shown in FIG. 6, when an error occurs in the $A^{th}$ bit of the existing fault information OLD FAULT_INFO, the fault information generator 230 may write A in the first error location LOC 1 of the first packet 41 and write 1, which is the number of errors having occurred in the $A^{th}$ bit, in the first error count CNT 1 of the first packet 41. In some implementations, the fault information generator 230 may write a type of the error, which has occurred in the $A^{th}$ bit, in the first packet 41. For example, as shown in FIG. 8, the fault information generator 230 may count the number '1' CNT of '1' errors when data programmed as '1' is read as '0' due to an error, and count the number '0' CNT of '0' errors when data programmed as '0' is read as '1' due to an error.

An ECC encoder 211 may generate a parity for the new fault information NEW FAULT_INFO and output the new fault information NEW FAULT_INFO and the parity. The new fault information NEW FAULT_INFO may be stored at the same address as the existing fault information OLD FAULT_INFO by overwrite or write-after-erase.

Figure 10:
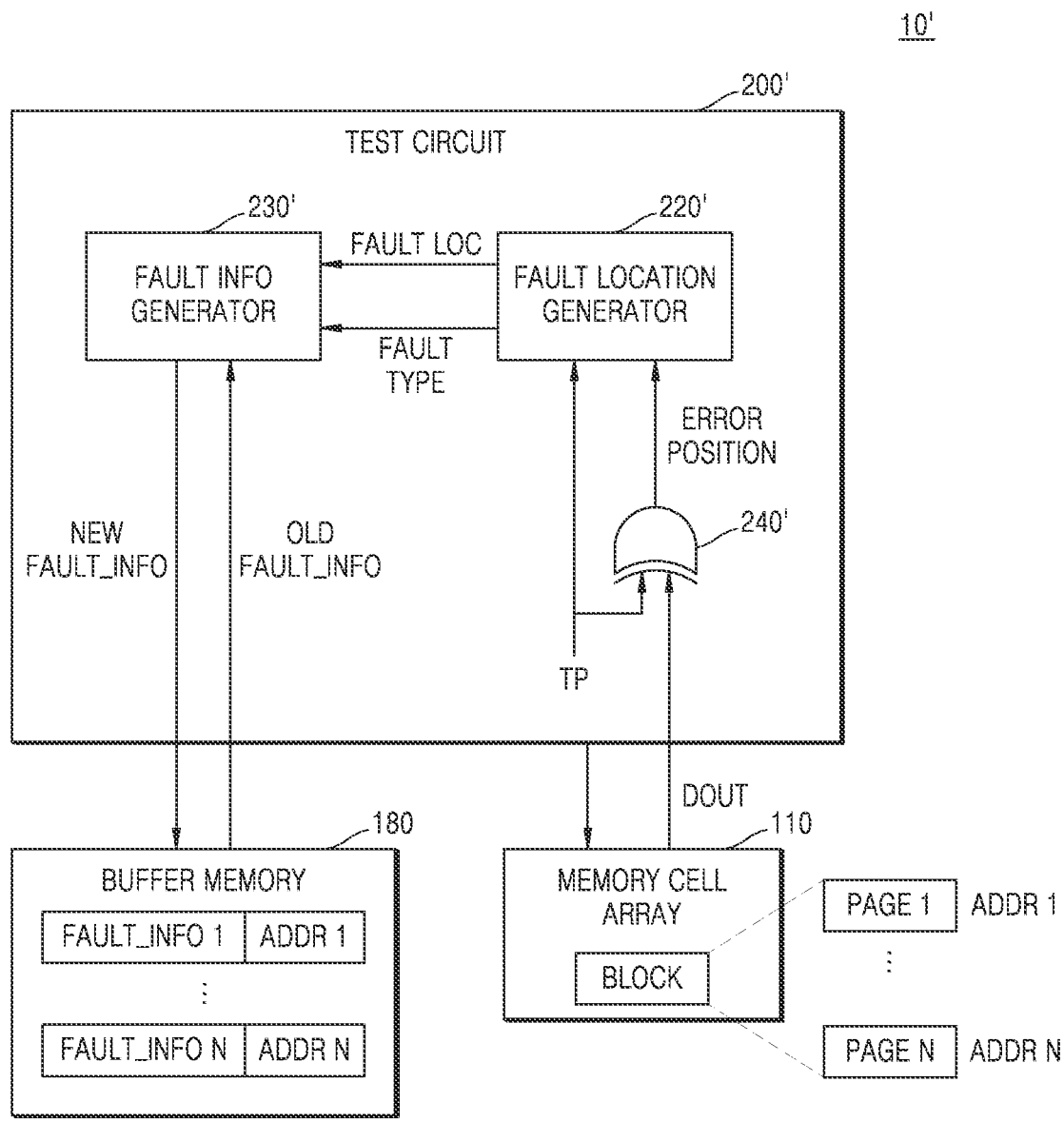
FIG. 10 is a block diagram illustrating an example of a semiconductor device.

FIG. 10 is a block diagram illustrating a semiconductor device 10'.

Referring to FIG. 10, the semiconductor device 10' may include the memory cell array 110, a test circuit 200', and a buffer memory 180.

The memory cell array 110 may include a memory block BLOCK, and the memory block BLOCK may include first to $N^{th}$ pages PAGE 1 to PAGE N (N is a natural number of 2 or greater). The first to $N^{th}$ pages PAGE 1 to PAGE N may correspond to first to $N^{th}$ addresses, respectively.

The test circuit 200' may program a test pattern TP in the memory cell array 110 and read data DOUT corresponding to the test pattern TP from the memory cell array 110. The test circuit 200' may repeat an operation of programming the test pattern TP in the memory cell array 110 and reading the data DOUT from the memory cell array 110 to cumulatively count the number of errors for each of bits constituting the read data DOUT. That is, a read operation is mainly described below, but the test pattern TP may be programmed in the memory cell array 110 before the read operation.

The test circuit 200' may include a fault location generator 220', a fault information generator 230', and an error bit information generator 240'.

The error bit information generator 240' may generate the error location information ERROR LOC by comparing the test pattern TP to the read data DOUT. Particularly, the error bit information generator 240' may perform an XOR operation between the test pattern TP and the read data DOUT to indicate '1' for error-occurred bits among bits constituting the read data DOUT and indicate '0' for non-error-occurred bits among the bits constituting the read data DOUT.

The fault location generator 220' may generate the fault location information FAULT LOC and the fault type FAULT TYPE based on the test pattern TP and the error location information ERROR LOC. An operation of the fault location generator 220' could be understood based on an operation of the fault location generator 220 of FIG. 9, and thus, a description thereof may be omitted.

The fault information generator 230' may receive the existing fault information OLD FAULT_INFO from the buffer memory 180 and cumulatively update the existing fault information OLD FAULT_INFO to the new fault information NEW FAULT_INFO based on the fault location information FAULT LOC and the fault type FAULT TYPE. That is, an error count of a packet corresponding to a location of an error-occurred bit among the bits constituting the existing fault information OLD FAULT_INFO may be increased to update the existing fault information OLD FAULT_INFO and generate the new fault information NEW FAULT_INFO.

The fault information generator 230' may store first to $N^{th}$ fault information FAULT_INFO 1 to FAULT_INFO N (N is a natural number of 2 or greater) in the buffer memory 180. The first to $N^{th}$ fault information FAULT_INFO 1 to FAULT_INFO N may correspond to the first to $N^{th}$ pages PAGE 1 to PAGE N, respectively. For example, the first fault information FAULT_INFO 1 may be fault information of the data DOUT read from the first page PAGE 1. The first to $N^{th}$ fault information FAULT_INFO 1 to FAULT_INFO N may be programmed with first to $N^{th}$ addresses ADDR 1 to ADDR N in the buffer memory 180.

By a test operation, a memory cell, of which an error count is a reference value or greater, among memory cells included in the memory cell array 110 may be determined as a fault cell. Information about an address of the fault cell may be stored in repair circuits 170A and 170B of FIGS. 11 and 12. That is, faulty cells may be determined based on locations of error bits and error counts obtained through a test operation, and as described below with reference to FIGS. 11 and 12, a repair operation of replacing the faulty cells by redundancy cells may be performed.

Figure 11:
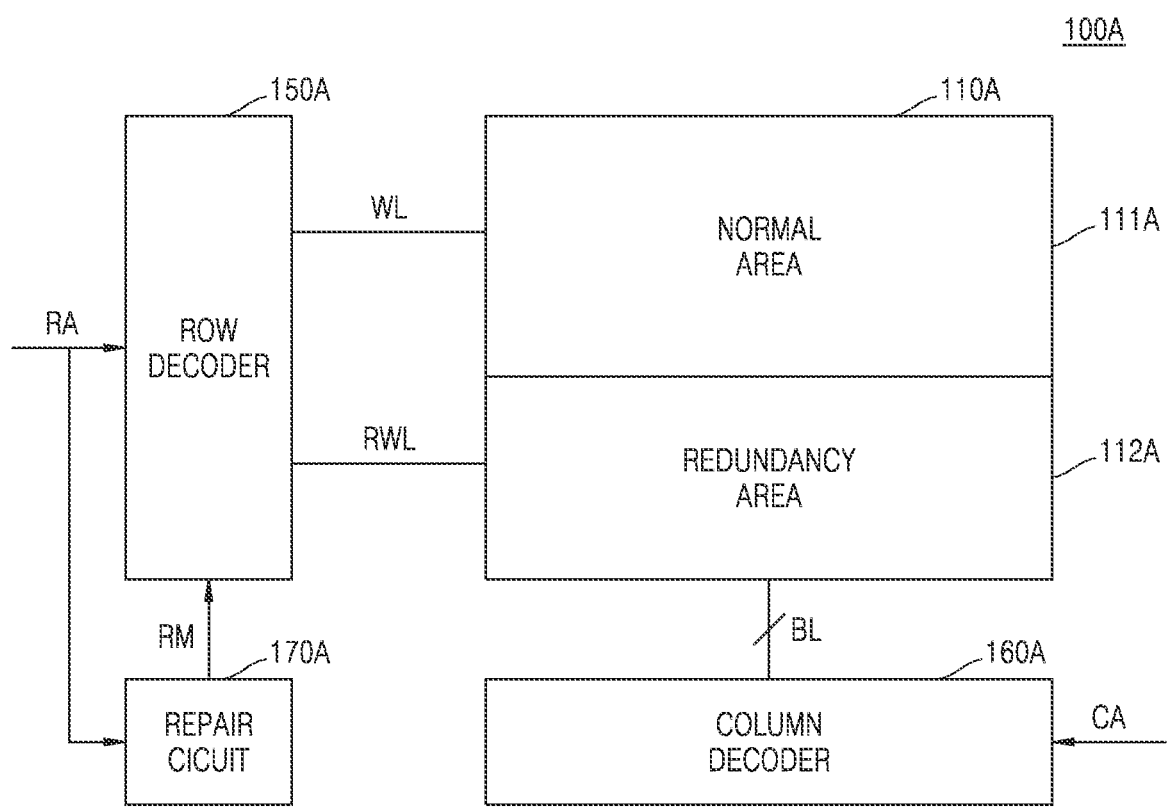
FIG. 11 is a block diagram illustrating an example of a memory device.

FIG. 11 is a block diagram illustrating a memory device 100A.

Referring to FIG. 11, the memory device 100A may include a memory cell array 110A, a repair circuit 170A, a row decoder 150A, and a column decoder 160A. In the specification, the row decoder 150A and the column decoder 160A may be referred to as a decoder circuit.

The memory cell array 110A may include a normal area 111A, in which a plurality of memory cells are arranged, and a redundancy area 112A, in which a plurality of redundancy memory cells are arranged. In some implementations, the redundancy area 112A may be adjacent to the normal area 111A in an extending direction of the plurality of bit lines BL. Particularly, the normal area 111A may include the plurality of memory cells respectively arranged in intersection regions of the plurality of word lines WL and the plurality of bit lines BL, and the redundancy area 112A may include the plurality of redundancy memory cells respectively arranged in intersection regions of a plurality of redundancy word lines RWL and the plurality of bit lines BL.

A fault may occur in at least one of the plurality of memory cells arranged in the normal area 111A. A fault cell, in which a fault has occurred, may be a single bit, a weak cell, or a defect cell. A fault cell included in the normal area 111A may be replaced by a redundancy memory cell included in the redundancy area 112A. This replace operation may be referred to as "a repair operation". By a repair operation, data to be stored in or read from a fault cell may be stored in or read from a redundancy memory cell.

In some implementations, a repair operation may be performed by a row repair method of replacing a row including a fault cell in the normal area 111A by a redundancy row in the redundancy area 112A. In some implementations, a repair unit may be a word line, and accordingly, a word line including a fault cell may be replaced by a redundancy word line. In some implementations, a repair unit may be a word line group, and accordingly, a word line group including a fault cell may be replaced by a redundancy word line group. For example, a word line group may correspond to two, four, eight, or sixteen word lines or the like. If the repair unit is two word lines, two word lines including a fault cell in the normal area 111A may be replaced by two redundancy word lines included in the redundancy area 112A.

The repair circuit 170A may control a repair operation on a fault cell among the plurality of memory cells. The repair circuit 170A may store a fault address obtained based on the fault information FAULT_INFO described above. Particularly, the repair circuit 170A may control a repair operation if an input address, e.g., a row address RA, of a memory cell to be accessed is a fault address of a fault cell. More particularly, the repair circuit 170A may generate a row matching signal RM if the row address RA is a fault address, and provide the generated row matching signal RM to the row decoder 150A. Particularly, the repair circuit 170A may compare a row address of a fault cell to the row address RA to determine whether the row address RA indicates the row address of the fault cell, and generate the row matching signal RM as the determination result. Accordingly, the row decoder 150A may activate redundancy word lines RWL in response to the row matching signal RM. The repair circuit 170A may be implemented by a one-time programmable memory, such as a laser-programmable fuse array, an antifuse array, or an electrically programmable fuse array, or a nonvolatile memory device, such as MRAM, RRAM, PRAM, or flash memory.

The row decoder 150A may select some of the plurality of word lines WL based on the row address RA and activate the selected word lines WL. In addition, the row decoder 150A may select some of the plurality of redundancy word lines RWL in response to the row matching signal RM and activate the selected redundancy word lines RWL. Particularly, the row decoder 150A may disable the row address RA and activate the selected redundancy word lines RWL, in response to the row matching signal RM. The column decoder 160A may select some of the plurality of bit lines BL based on a column address CA. For example, the column decoder 160A can select some of the plurality of bit lines BL in response to receiving the column address CA.

Figure 12:
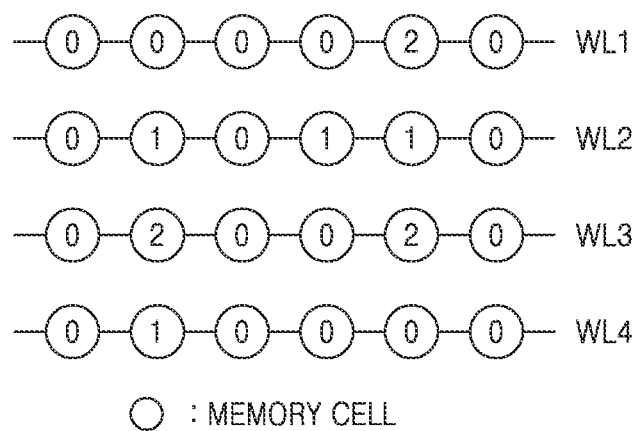
FIG. 12 illustrates an example of a method of detecting a fault address.

FIG. 12 illustrates an example of a method of detecting a fault address.

Referring to FIGS. 11 and 12, as a result of cumulatively updating error information N times (N is a positive integer), error counts of memory cells connected to first to fourth word lines WL1 to WL4 included in the normal area 111A may be obtained. For example, the first word line WL1 may be connected to memory cells of which error counts are 0, 0, 0, 0, 2, and 0. The number of word lines and the number of memory cells connected to each word line are not limited thereto.

If the number of fault cells each having an error count greater than or equal to a first reference value among memory cells connected to a word line WL is greater than or equal to a second reference value, the word line may be referred to as a fault word line, and an address of the fault word line may be referred to as a fault row address. For example, an address of the third word line WL3, in which two or more fault cells each having an error count greater than or equal to 2 are connected, may be detected as a fault row address. However, the present disclosure is not limited thereto, and both the first reference value and the second reference value may be 1.

A method of detecting a fault row address is not limited thereto, and a fault row address may be detected by various methods based on the number of error bits and an error count for each error bit.

Figure 13:
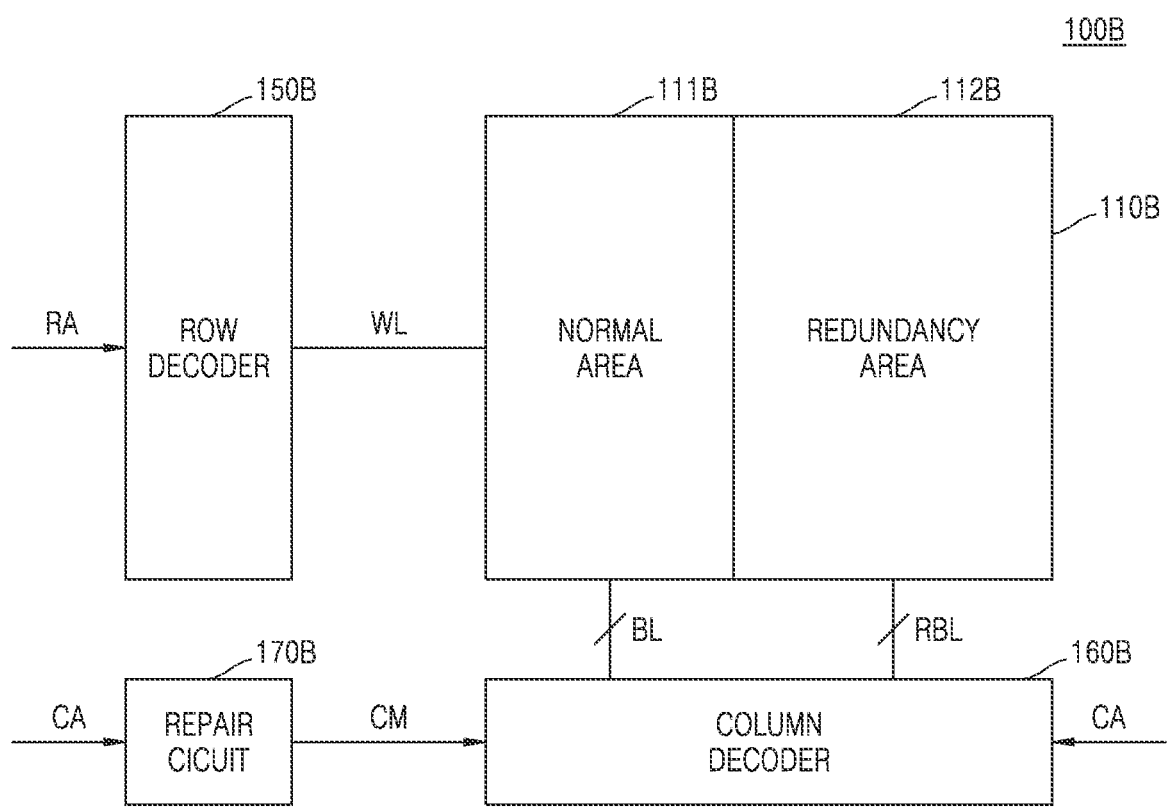
FIG. 13 is a block diagram illustrating an example of a memory device.

FIG. 13 is a block diagram illustrating a memory device 100B. Referring to FIG. 13, the memory device 100B may include a memory cell array 110B, a repair circuit 170B, a row decoder 150B, and a column decoder 160B. The memory device 100B is a modified version of the memory device 100A of FIG. 11, and a description made with reference to FIG. 11 is not repeated herein.

The memory cell array 110B may include a normal area 111B, in which a plurality of memory cells are arranged, and a redundancy area 112B, in which a plurality of redundancy memory cells are arranged. In some implementations, the redundancy area 112B may be adjacent to the normal area 111B in an extending direction of the plurality of word lines WL. Particularly, the normal area 111B may include a plurality of memory cells respectively arranged in intersection regions of the plurality of word lines WL and the plurality of bit lines BL, and the redundancy area 112B may include a plurality of redundancy memory cells respectively arranged in intersection regions of the plurality of word lines WL and a plurality of redundancy bit lines RBL.

A fault may occur in at least one of the plurality of memory cells arranged in the normal area 111B, fault cells included in the normal area 111B may be replaced by redundancy memory cells included in the redundancy area 112B by a repair operation. By a repair operation, data to be written in or read from a fault cell may be written in or read from a redundancy memory cell.

In the present example, a repair operation may be performed by a column repair method of replacing a column including a fault cell in the normal area 111B by a redundancy column in the redundancy area 112B. In some implementations, a repair unit may be a bit line, and accordingly, a bit line including a fault cell may be replaced by a redundancy bit line. In some implementations, a repair unit may be a bit line group, and accordingly, a bit line group including a fault cell may be replaced by a redundancy bit line group. For example, a bit line group may correspond to two, four, eight, or sixteen bit lines or the like. If the repair unit is two bit lines, two bit lines including a fault cell in the normal area 111B may be replaced by two redundancy bit lines included in the redundancy area 112B.

The repair circuit 170B may control a repair operation on a fault cell among the plurality of memory cells. The repair circuit 170B may store information about a fault cell obtained based on the fault information FAULT_INFO described above. Particularly, the repair circuit 170B may control a repair operation if an input address, e.g., the column address CA, of a memory cell to be accessed is a fault address. More particularly, the repair circuit 170B may generate a column matching signal CM if the column address CA is a fault address, and provide the generated column matching signal CM to the column decoder 160B. Particularly, the repair circuit 170B may compare a column address of a fault cell to the column address CA to determine whether the column address CA indicates a column address of a fault cell, and generate the column matching signal CM as the determination result. Accordingly, the column decoder 160B may activate redundancy column lines RBL in response to the column matching signal CM.

The row decoder 150B may select some of the plurality of word lines WL based on the row address RA and activate the selected word lines WL. For example, the row decoder 150B can select some of the plurality of the word lines WL in response to receiving the row address RA. The column decoder 160B may select some of the plurality of bit lines BL based on the column address CA and activate the selected bit lines BL. In addition, the column decoder 160B may select some of the plurality of redundancy bit lines RBL in response to the column matching signal CM and activate the selected redundancy bit lines RBL. Particularly, the column decoder 160B may disable the column address CA and activate the selected redundancy bit lines RBL, in response to the column matching signal CM.

Figure 14:
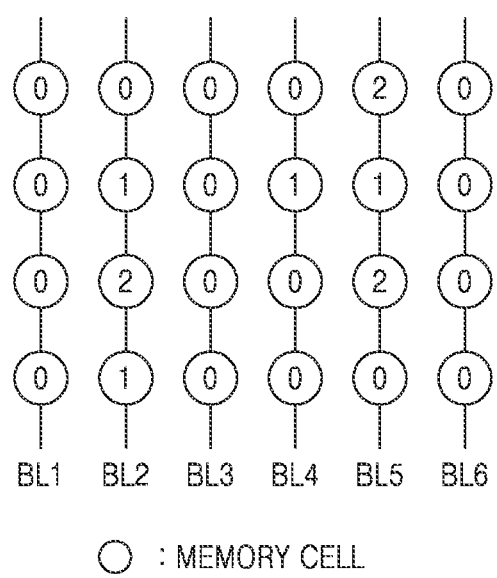
FIG. 14 illustrates an example of a method of detecting a fault address.

FIG. 14 illustrates an example of a method of detecting a fault address.

Referring to FIGS. 13 and 14, as a result of cumulatively updating error information N times (N is a positive integer), error counts of memory cells connected to first to sixth bit lines BL1 to BL6 included in the normal area 111B may be obtained. For example, the first bit line BL1 may be connected to memory cells of which error counts are 0, 0, 0, and 0. The number of bit lines and the number of memory cells connected to each bit line are not limited thereto.

If the number of fault cells each having an error count greater than or equal to the first reference value among memory cells connected to a bit line BL is greater than or equal to the second reference value, the bit line may be referred to as a fault bit line, and an address of the fault bit line may be referred to as a fault column address. For example, an address of the fifth bit line BL5, in which two or more fault cells each having an error count greater than or equal to 2 are connected, may be detected as a fault column address.

However, a method of detecting a fault column address is not limited thereto, and a fault column address may be detected by various methods based on the number of error bits and an error count for each error bit.

Figure 15:
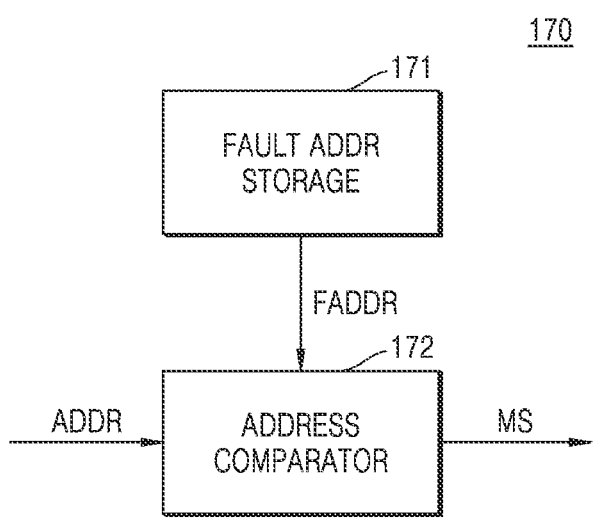
FIG. 15 is a block diagram illustrating an example of a repair circuit.

FIG. 15 is a block diagram illustrating a repair circuit 170.

Referring to FIG. 15, the repair circuit 170 may include a fault address storage 171 and an address comparator 172. Although FIG. 15 shows that the fault address storage 171 is included in the repair circuit 170, other arrangements are possible. The fault address storage 171 may be included in the memory device 100 of FIG. 1 separately from the repair circuit 170. Alternatively, the fault address storage 171 may be provided outside the memory device 100, e.g., included in a memory controller 2100 of FIG. 16 or the test circuit 200 of FIG. 1.

The fault address storage 171 may store location information, e.g., a fault address FADDR, of at least one fault cell included in the normal area 111A of FIG. 11 or 111B of FIG. 13. In some implementations, the fault address FADDR may be a row address, e.g., a fault row address, of a fault cell. For example, as described above with reference to FIG. 12, a fault cell may be a cell, of which an error count of a stored bit is greater than or equal to the first reference value. In some implementations, the fault address FADDR may be a column address, i.e., a fault column address, of a fault cell. The fault address FADDR may be obtained by a test operation on the memory device 100A. This test operation may be performed in a wafer level or a package level of the memory device 100A. The fault address storage 171 may be implemented by a one-time programmable memory, such as a laser-programmable fuse array, an anti-fuse array, or an electrically programmable fuse array, or a nonvolatile memory device, such as magnetic RAM (MRAM), resistive RAM (RRAM), parallel RAM (PRAM), or flash memory.

The address comparator 172 may compare the fault row address to the row address RA. Particularly, the address comparator 172 may compare the fault row address FRA to the row address RA, and output the row matching signal RM if the fault row address FRA matches the row address RA as the comparison result. In some implementations, the address comparator 172 may compare the fault column address to the column address CA. Particularly, the address comparator 172 may compare the fault column address FCA to the column address CA, and output the column matching signal CM if the fault column address FCA matches the column address CA as the comparison result.

Figure 16:
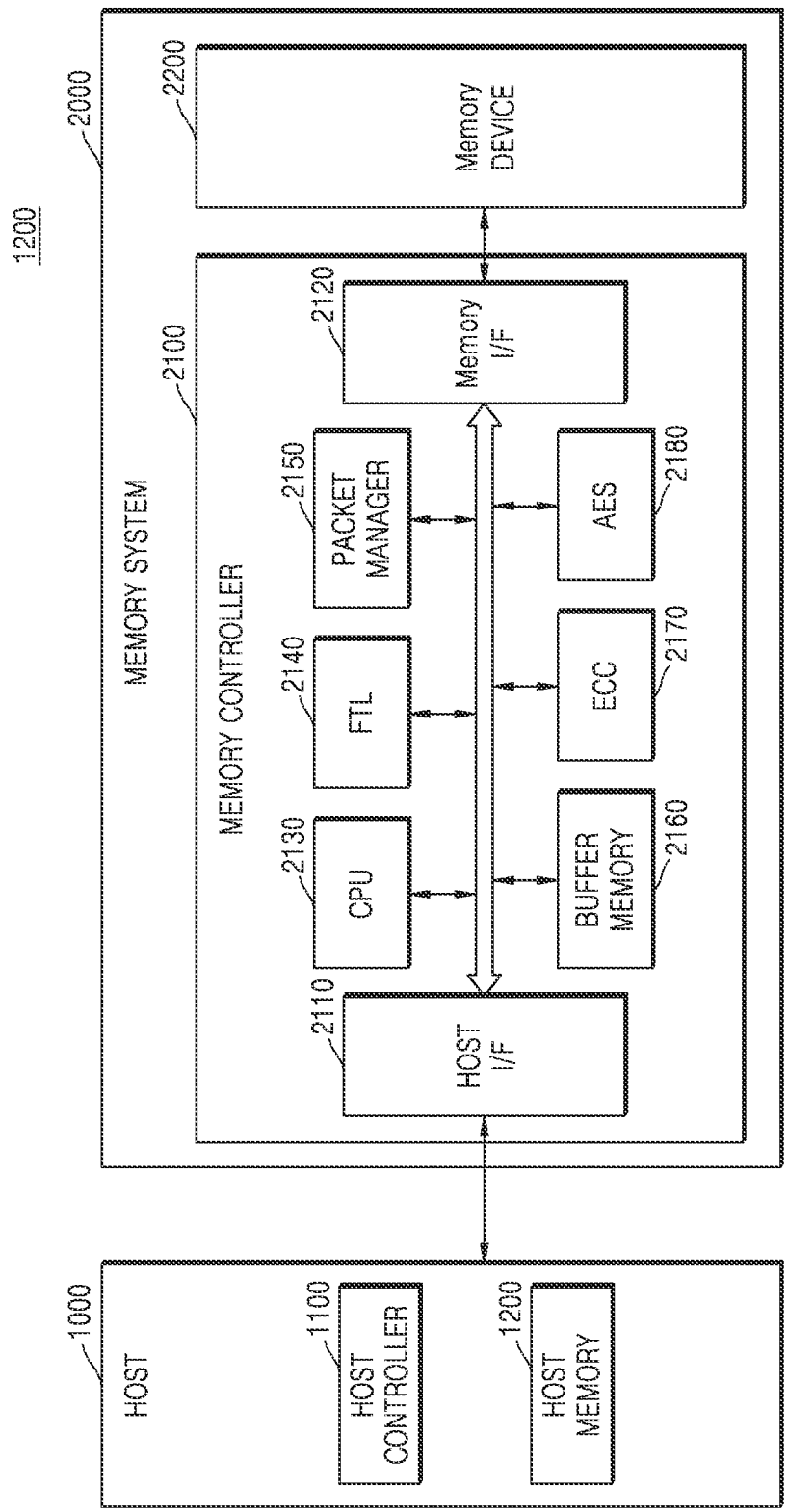
FIG. 16 is a block diagram illustrating an example of a host memory.

FIG. 16 is a block diagram of an example of host memory 1200.

The host memory 1200 may include a host 1000 and a memory system 2000. Further, the memory system 2000 may include the memory controller 2100 and a memory device 2200. In some implementations, the host 1000 may include a host controller 1100 and a host memory 1200. The host memory 1200 may serve as a buffer memory configured to temporarily store data to be transmitted to the memory system 2000 or data received from the memory system 2000.

The memory system 2000 may include storage media configured to store data in response to requests from the host 1000. As an example, the memory system 2000 may include at least one of a solid state drive (SSD), an embedded memory, and a removable external memory. When the memory system 2000 is an SSD, the memory system 2000 may be a device that conforms to an NVMe standard. When the memory system 2000 is an embedded memory or an external memory, the memory system 2000 may be a device that conforms to a UFS standard or an eMMC standard. Each of the host 1000 and the memory system 2000 may generate a packet according to an adopted standard protocol and transmit the packet.

When the MEMORY DEVICE 2200 of the memory system 2000 includes a flash memory, the flash memory may include a 2D NAND memory array or a 3D (or vertical) NAND (VNAND) memory array. As another example, the memory system 2000 may include various other kinds of NVMs. For example, the memory system 2000 may include magnetic RAM (MRAM), spin-transfer torque MRAM, conductive bridging RAM (CBRAM), ferroelectric RAM (FRAM), parallel RAM (PRAM), resistive RAM (RRAM), and various other kinds of memories.

In some implementations, the host controller 1100 and the host memory 1200 may be implemented as separate semiconductor chips. Alternatively, in some implementations, the host controller 1100 and the host memory 1200 may be integrated in the same semiconductor chip. As an example, the host controller 1100 may be any one of a plurality of modules included in an application processor (AP). The AP may be implemented as a System on Chip (SoC). Furthermore, the host memory 1200 may be an embedded memory included in the AP or an NVM or memory module located outside the AP.

The host controller 1100 may manage an operation of storing data (e.g., write data) of a buffer region of the host memory 1200 in the MEMORY DEVICE 2200 or an operation of storing data (e.g., read data) of the MEMORY DEVICE 2200 in the buffer region.

The memory controller 2100 may include a host interface 2110, a memory interface 2120, and a CPU 2130. Furthermore, the memory controller 2100 may further include a flash translation layer (FTL) 2140, a packet manager 2150, a buffer memory 2160, an ECC circuit 2170, and an advanced encryption standard (AES) engine 2180. The memory controller 2100 may further include a working memory (not shown) in which the FTL 2140 is loaded. The CPU 2130 may execute the FTL 2140 to control data write and read operations on the MEMORY DEVICE 2200.

The host interface 2110 may transmit and receive packets to and from the host 1000. A packet transmitted from the host 1000 to the host interface 2110 may include a command or data to be written to the MEMORY DEVICE 2200. A packet transmitted from the host interface 2110 to the host 1000 may include a response to the command or data read from the MEMORY DEVICE 2200. The memory interface 2120 may transmit data to be written to the MEMORY DEVICE 2200 to the MEMORY DEVICE 2200 or receive data read from the MEMORY DEVICE 2200. The memory interface 2120 may be configured to comply with a standard protocol, such as Toggle or open NAND flash interface (ONFI).

The FTL 2140 may perform various functions, such as an address mapping operation, a wear-leveling operation, and a garbage collection operation. The address mapping operation may be an operation of converting a logical address received from the host 1000 into a physical address used to actually store data in the MEMORY DEVICE 2200. The wear-leveling operation may be a technique for preventing excessive deterioration of a specific block by allowing blocks of the MEMORY DEVICE 2200 to be uniformly used. As an example, the wear-leveling operation may be implemented using a firmware technique that balances erase counts of physical blocks. The garbage collection operation may be a technique for ensuring usable capacity in the MEMORY DEVICE 2200 by erasing an existing block after copying valid data of the existing block to a new block.

The packet manager 2150 may generate a packet according to a protocol of an interface, which consents to the host 1000, or parse various types of information from the packet received from the host 1000. In addition, the buffer memory 2160 may temporarily store data to be written to the MEMORY DEVICE 2200 or data to be read from the MEMORY DEVICE 2200. Although the buffer memory 2160 may be a component included in the memory controller 2100, the buffer memory 2160 may be outside the memory controller 2100.

The ECC circuit 2170 may perform error detection and correction operations on read data read from the MEMORY DEVICE 2200. More specifically, the ECC circuit 2170 may generate parity bits for write data to be written to the MEMORY DEVICE 2200, and the generated parity bits may be stored in the MEMORY DEVICE 2200 together with write data. During the reading of data from the MEMORY DEVICE 2200, the ECC circuit 2170 may correct an error in the read data by using the parity bits read from the MEMORY DEVICE 2200 along with the read data, and output error-corrected read data. In some implementations, the ECC circuit 2170 may detect and correct less error bits, compared to the ECC circuit 210 of FIG. 1.

The AES engine 2180 may perform at least one of an encryption operation and a decryption operation on data input to the memory controller 2100 by using a symmetric-key algorithm.

In some implementations, the memory controller 2100 may include the test circuit 200 of FIG. 1.

Figure 17:
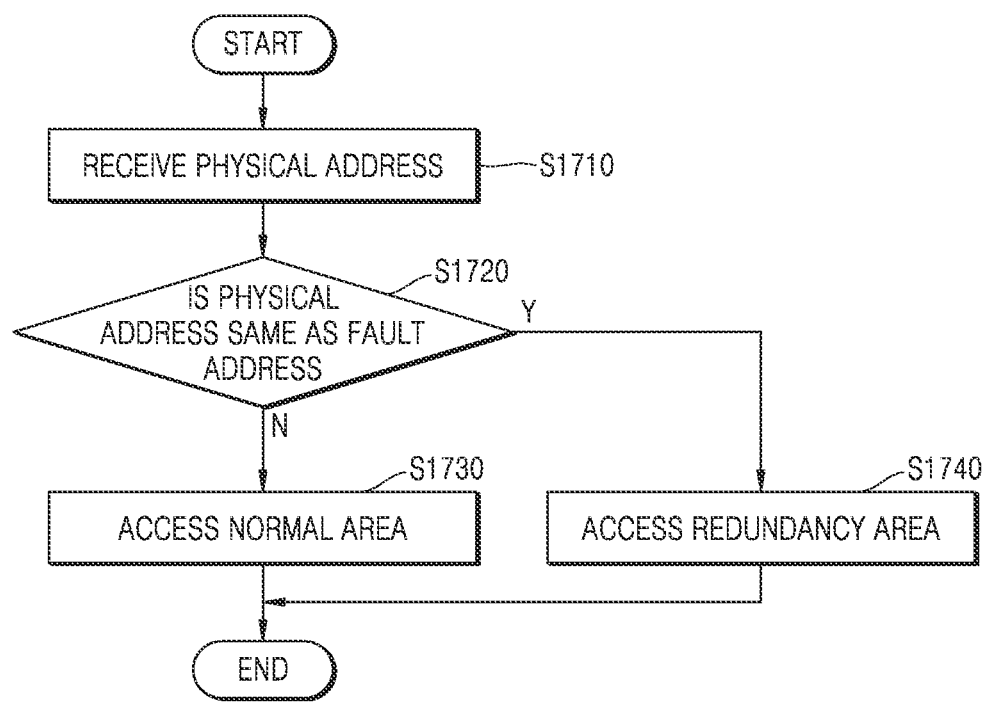
FIG. 17 is a flowchart illustrating an example of a repair operation method of a memory device.

FIG. 17 is a flowchart illustrating an example of a repair operation method of a memory device. FIG. 17 is described with reference to FIGS. 1 and 11 to 15. The repair operation method of the memory device may include a plurality of operations S1710 to S1740.

In operation S1710, the memory device 100 may receive a physical address from a memory controller (e.g., 2100 of FIG. 16). The physical address may be received through a DQ pin.

In operation 51720, the repair circuit 170 may compare the physical address to a fault address. If the physical address is the same as the fault address, the repair operation method may proceed to operation S1740, otherwise, if the physical address is not the same as the fault address, the repair operation method may proceed to operation S1730. The fault address may be a fault row address or a fault column address as described above with reference to FIG. 12 or 14.

In operation S1730, the memory device 100 may access the normal area 111A or 111B. For example, the memory device 100 may program data in the normal area 111A or 111B or read data from the normal area 111A or 111B.

In operation S1740, the memory device 100 may access the redundancy area 112A or 112B. For example, the memory device 100 may program data in the redundancy area 112A or 112B or read data from the redundancy area 112A or 112B.

While the inventive concept has been particularly shown and described with reference to embodiments thereof, it will be understood that various changes in form and details may be made therein without departing from the spirit and scope of the following claims.

What is claimed is:

1. A method of operating a memory device, wherein the memory device comprises a memory cell array including a normal area, a redundancy word line, and a redundancy area, the method comprising:
performing a plurality of program operations on the normal area based on a test pattern;
following each program operation, performing a read operation based on the test pattern; and
following each read operation,
detecting one or more error bits with respect to the test pattern,
identifying, for each error bit of the one or more error bits, a corresponding location of a cell containing the error bit among a plurality of memory cells included in the normal area, and
updating an error count for each identified location.

2. The method of claim 1, further comprising repairing faulty cells included in the normal area with redundancy cells in the redundancy area based on the identified corresponding locations of the one or more error bits and the error count for each identified location.

3. The method of claim 1, wherein performing each read operation comprises generating, as the test pattern, a plurality of packets each including the corresponding location of an error bit of the one or more error bits and an accumulated error count of the location, based on an error correction operation on the test pattern read for read operation, and
wherein performing the plurality of program operations comprises programming the plurality of packets in the memory cell array after each read operation ends.

4. The method of claim 1, wherein performing each read operation comprises:

generating a plurality of packets each including the corresponding location of an error bit of the one or more error bits and an accumulated error count of the location, based on the test pattern read for each read operation; and updating the plurality of packets in a buffer memory after a read operation of reading a test pattern including the error bit ends.

5. The method of claim 4, wherein generating the plurality of packets comprises:

generating a bit sequence indicating the corresponding locations of the one or more error bits by comparing the test pattern to a reference pattern for each read operation;

converting the locations of the error bits into a digital value based on the bit sequence; and recording the locations of the error bits in the plurality of packets, respectively, based on the digital value.

6. The method of claim 4, wherein updating the plurality of packets in the buffer memory after the read operation of reading the test pattern including the error bit ends comprises storing, together with the plurality of packets, an address of a storage region, in which the test pattern is stored, among a plurality of storage regions included in the normal area.

7. The method of claim 1, wherein the one or more error bits comprise error bits read as '1' and error bits read as '0'.

8. The method of claim 2, wherein repairing the faulty cells with the redundancy cells comprises accessing the redundancy cells included in the redundancy area based on an address of a storage region, of which a number of error bits each having an error count greater than or equal to a first reference value is greater than or equal to a second reference value, among a plurality of storage regions included in the normal area.

9. The method of claim 8, wherein accessing the redundancy cells included in the redundancy area comprises activating the redundancy word line based on a row address of a fault storage region.

10. The method of claim 8, wherein accessing the redundancy cells included in the redundancy area comprises activating a redundancy bit line connected to the redundancy area, based on a column address of a fault storage region.

11. A semiconductor device comprising:

a memory cell array including a normal area containing a plurality of normal memory cells and a redundancy area containing a plurality of redundancy memory cells; and a test circuit configured to:

detect whether an error has occurred in each normal memory cell of the plurality of normal memory cells, and obtain an error count of each normal memory cell, based on a plurality of write operations and a plurality of read operations performed on the plurality of normal memory cells with a test pattern, wherein the test circuit is configured to perform each read operation of the plurality of read operations following a respective write operation of the plurality of write operations.

12. The semiconductor device of claim 11, further comprising:

a decoder circuit configured to select a normal memory cell or a redundancy memory cell based on an address; and a repair circuit configured to control the decoder circuit to select the redundancy memory cell, in response to detecting an address of a faulty cell, wherein detecting an address of the faulty cell is based on whether an error has occurred and the error count.

13. The semiconductor device of claim 11, wherein the test circuit is further configured to repeatedly perform the plurality of write operations and the plurality of read operations on the normal area with the test pattern, and to obtain locations of error bits and an error count for each error bit location with respect to the test pattern based on the plurality of read operations.

14. The semiconductor device of claim 11, wherein the test circuit comprises:

an error correction code (ECC) circuit configured to output error corrected data and a bit sequence indicating locations of error bits among bits constituting the test pattern;

fault location generation circuitry configured to calculate an error location value indicating the locations of the error bits based on the bit sequence; and a fault information generation circuitry configured to generate a plurality of packets each including a location of an error-occurred bit among the bits constituting the test pattern and an error count corresponding to the location, based on the error location value, and to generate the test pattern by merging the plurality of packets.

15. The semiconductor device of claim 14, wherein the fault location generation circuitry is further configured to generate information about types of the error bits based on the bit sequence and the error corrected data, and the fault information generation circuitry is further configured to record the types of the error bits in the plurality of packets.

16. The semiconductor device of claim 11, further comprising a buffer memory storing a plurality of packets each including a location of an error bit among bits constituting a read result of the test pattern and an error count corresponding to the location, wherein the test circuit comprises:

an error bit information generator configured to compare the read result of the test pattern to the test pattern and output a bit sequence indicating locations of error bits among bits constituting the test pattern;

fault location generation circuitry configured to calculate an error location value indicating the locations of the error bits based on the bit sequence; and fault information generation circuitry configured to generate a plurality of packets each including a location of an error-occurred bit among the bits constituting the test pattern and an error count corresponding to the location, based on the error location value, and to update the plurality of packets in the buffer memory.

17. The semiconductor device of claim 12, wherein the repair circuit comprises:

a fault address storage storing a fault address of the faulty cell; and an address comparator configured to compare the address to the fault address and to output a matching signal for controlling the normal area or the redundancy area based on a comparison of the address and the fault address.

18. A method of a testing a memory device, wherein the memory device comprises a memory cell array including a normal area and a redundancy area, the method comprising:

performing a plurality of program operations on a normal area based on a test pattern;

following each program operation, performing a read operation on the test pattern;

following each read operation, updating locations of error bits among bits constituting the test pattern and an error count for each location, based on an error correction operation on a result of the read operation; and detecting a fault storage region among storage regions included in the normal area, based on the locations of the error bits and the error count for each location.

19. The method of claim 18, wherein detecting the fault storage region comprises detecting, as the fault storage region, a storage region, of which a number of the error bits each having an error count greater than or equal to a first reference value is greater than or equal to a second reference value, among the storage regions.

20. The method of claim 18, wherein obtaining the locations of the error bits and the error count for each error location comprises accumulating numbers of the error bits, which are obtained by performing an error correction operation on a result of the read operation.

* * * * *